(12) United States Patent
Lien et al.

(10) Patent No.: US 10,033,420 B2
(45) Date of Patent: Jul. 24, 2018

(54) WIRELESS COMMUNICATION RECEIVER

(71) Applicant: MEDIATEK Inc., Hsin-Chu (TW)

(72) Inventors: Yuan-Ching Lien, Taipei (TW); Eric Klumperink, Enschede (NL); Bram Nauta, Enschede (NL)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/469,690

(22) Filed: Mar. 27, 2017

(65) Prior Publication Data

US 2017/0373710 A1    Dec. 28, 2017

Related U.S. Application Data

(60) Provisional application No. 62/353,587, filed on Jun. 23, 2016.

(51) Int. Cl.
| | | |
|---|---|---|
| *H04B 1/26* | (2006.01) | |
| *H04B 1/28* | (2006.01) | |
| *H04B 1/10* | (2006.01) | |
| *H04B 1/16* | (2006.01) | |
| *H03H 11/12* | (2006.01) | |

(52) U.S. Cl.
CPC ............ *H04B 1/16* (2013.01); *H03H 11/1204* (2013.01); *H04B 1/1018* (2013.01)

(58) Field of Classification Search
CPC ........... H03H 11/0433; H03H 11/0455; H03H 11/0466; H03H 11/0477; H04B 1/16
USPC ................................................. 455/307, 333
See application file for complete search history.

(56) References Cited

U.S. PATENT DOCUMENTS

| | | | |
|---|---|---|---|
| 7,385,443 B1 * | 6/2008 | Denison | H03F 3/38 330/10 |
| 9,071,219 B2 | 6/2015 | De Geronimo et al. | |
| 9,263,995 B2 | 2/2016 | Wang et al. | |

(Continued)

FOREIGN PATENT DOCUMENTS

WO    2011044585 A1    4/2011

OTHER PUBLICATIONS

Andrews, et al.: "A Passive-Mixer-First Receiver with Baseband-Controlled RF Impedance Matching, < 6dB NF, and > 27dBm Wideband IIP3"; ISSCC 2010 / Session 2 / mm-Wave Beamforming & RF Building Blocks / 2.5; pp. 46-48.

(Continued)

*Primary Examiner* — Simon Nguyen
(74) *Attorney, Agent, or Firm* — McClure, Qualey & Rodack, LLP

(57) ABSTRACT

Provided is a wireless communication receiver including an antenna for receiving an RF signal; a first mixer, coupled to the antenna, for performing frequency conversion on the RF signal from the antenna by mixing the RF signal with a local oscillator signal to provide a first intermediate frequency (IF) signal; and a first filter, coupled to the first mixer, configured to pass a predetermined band of frequencies of the first IF signal and to generate a first channel signal. The first filter includes a negative feedback loop coupled to the first mixer for performing negative feedback loop control on the first IF signal; and a positive capacitive feedback loop coupled to the first mixer for performing positive capacitive feedback loop control on the first IF signal, the negative feedback loop and the positive capacitive feedback loop being coupled in parallel.

5 Claims, 5 Drawing Sheets

(56) References Cited

U.S. PATENT DOCUMENTS

| | | | | |
|---|---|---|---|---|
| 2007/0237273 A1* | 10/2007 | Tan | .................... | H03H 11/1291 |
| | | | | 375/350 |
| 2012/0196555 A1* | 8/2012 | Igarashi | ................... | H04B 1/30 |
| | | | | 455/341 |
| 2013/0095779 A1* | 4/2013 | Katsube | ............. | H03H 11/1252 |
| | | | | 455/232.1 |
| 2015/0137882 A1* | 5/2015 | Ciubotaru | .......... | H03H 11/0405 |
| | | | | 327/558 |
| 2015/0180523 A1* | 6/2015 | Tasic | ........................ | H04B 1/26 |
| | | | | 375/316 |
| 2017/0040972 A1* | 2/2017 | Taya | .................. | H03H 11/1252 |

OTHER PUBLICATIONS

Chen, et al.: "Reconfigurable Receiver With Radio-Frequency Current-Mode Complex Signal Processing Supporting Carrier Aggregation"; IEEE Journal of Solid-State Circuits, vol. 50, No. 12, Dec. 2015; pp. 3032-3046.

Andrews, et al.: "Implications of Passive Mixer Transparency for Impedance Matching and Noise Figure in Passive Mixer-First Receivers"; IEEE Transactions on Circuits and Systems—I: Regular Papers, vol. 57, No. 12, Dec. 2010; pp. 3092-3103.

Soer, et al.: :A 0.2-to-2.0GHz 65nm CMOS Receiver Without LNA Achieving >11dBm IIP3 and <6.5 dB NF; ISSCC 2009 / Session 12 / RF Building Blocks / 12.4; pp. 221-224.

Darvishi, et al.: "A 0.3-to-1.2GHz Tunable 4th-Order Switched gm-C Bandpass Filter with >55dB Ultimate Rejection and Out-of-Band IIP3 of +29dBm"; ISSCC 2012 / Session 21 / Analog Techniques / 21.1; pp. 358-360.

TIPO Office Action dated Jan. 12, 2018 in Taiwan application (No. 106115939).

* cited by examiner

WIRELESS COMMUNICATION RECEIVER

This application claims the benefit of U.S. Provisional Patent application Ser. No. 62/353,587, filed Jun. 23, 2016, the disclosure of which is incorporated by reference herein in its entirety.

TECHNICAL FIELD

The disclosure relates in general to a wireless communication receiver.

BACKGROUND

Many modern radio frequency (RF) receivers use a direct conversion or zero-IF (ZIF) architecture. RF signals received at an antenna are fed through mixer driven by a local oscillator (LO) and subsequently filtered to produce a baseband channel demodulated output signal. Ideally, RF power amplifiers of the RF receiver would act linearly, faithfully reproducing an amplified RF signal at their output with no distortion.

As for the design targets for the RF receiver, low noise figure (NF), high third-order intercept point (IIP3) and high central frequency (fc) are required.

The mixer-first receiver has advantages, for example, good linearity, high tunable Q and low NF. The requirement on improving the IIP3 of the receiver is one of the issues.

Further, to reject out-band signals, higher order BPF (band pass filter) may be used. But, numerous off-chip BPF would increase the device cost.

Thus, there needs a wireless communication receiver architecture which achieves high linearity and requires simple external low cost LPF (low pass filter) or BPF.

SUMMARY

According to one embodiment, provided is a wireless communication receiver including an antenna for receiving a wireless communication signal; a first mixer, coupled to the antenna, for performing frequency conversion on the received wireless communication signal from the antenna by mixing the wireless communication signal with a local oscillator signal to provide a first intermediate frequency (IF) signal; and a first filter, coupled to the first mixer, configured to pass a predetermined band of frequencies of the first IF signal of the first mixer and to generate a first channel signal. The first filter includes: a negative feedback loop coupled to the first mixer for performing negative feedback loop control on the first IF signal from the first mixer; and a positive capacitive feedback loop coupled to the first mixer for performing positive capacitive feedback loop control on the first IF signal from the first mixer, the negative feedback loop and the positive capacitive feedback loop being coupled in parallel.

Figure 1:
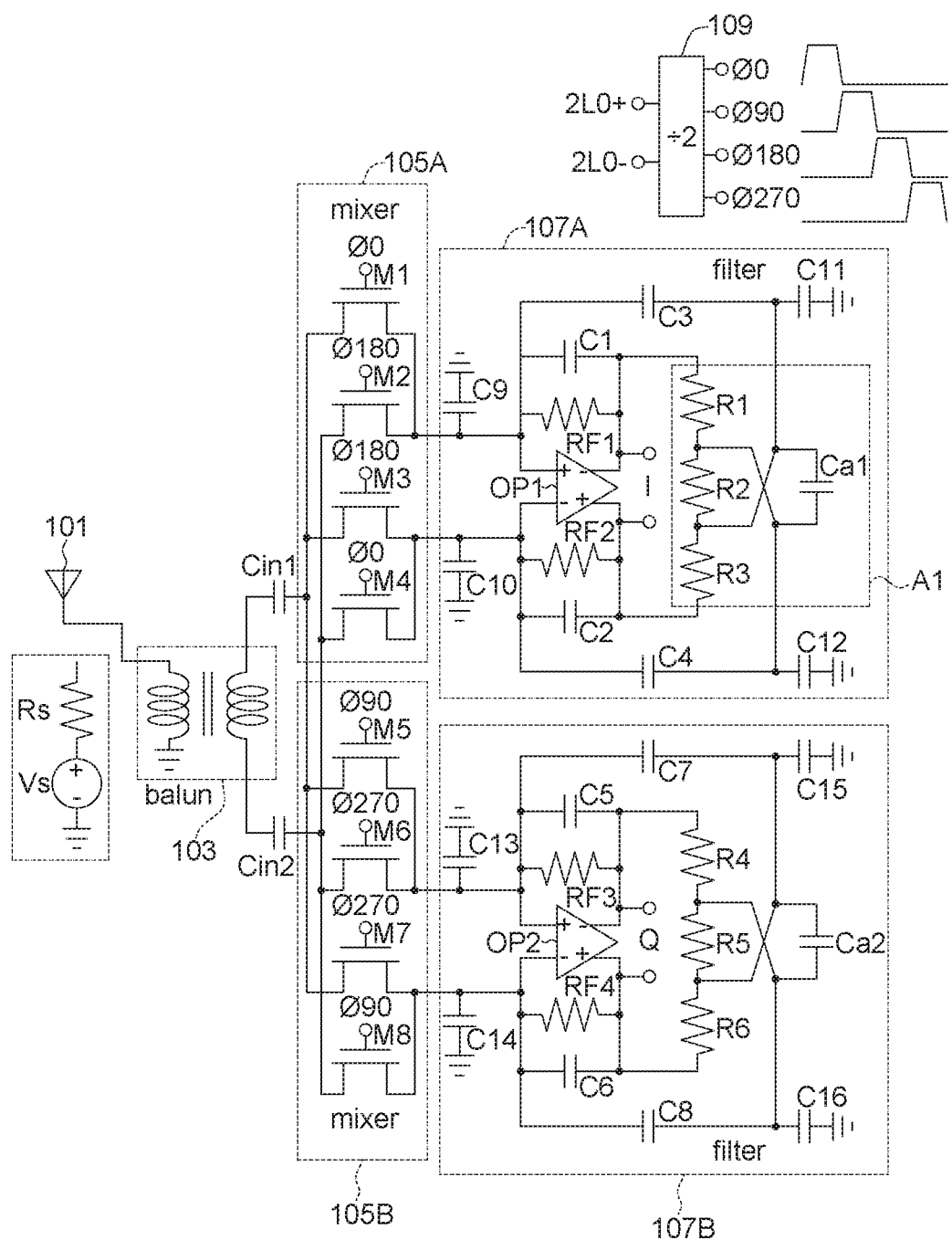
FIG. 1 shows a circuit diagram for a wireless communication receiver according to an embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Disclosed are wireless communication receiver structures. Note, embodiments described herein include various elements and limitations, with no one element or limitation contemplated as being a critical element or limitation. Each of the claims individually recites an aspect of the invention in its entirety. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations.

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a circuit diagram for a wireless communication receiver according to an embodiment of the application. The wireless communication receiver 100 includes an antenna 101, a plurality of mixers (two mixers 105A and 105B in this embodiment, but the application is not limited by) and a plurality of filters (two filters 107A and 107B in this embodiment, but the application is not limited by). The wireless communication receiver may further optionally include a balun (balanced to unbalanced) circuit 103 and two input capacitors Cin1 and Cin2. In other possible embodiments of the application, the input capacitors Cin1 and Cin2 may be omitted.

The antenna 101 is for receiving an RF signal. In FIG. 1, the equivalent circuit model of the antenna 101 is also shown, which includes a serially-connected resistor element Rs and a voltage source Vs.

The balun circuit 103 is coupled to the antenna 101. The balun circuit 103 is an electrical device that converts between a balanced signal and an unbalanced signal. The details of the balun circuit 103 are not specified here for simplicity.

The mixers 105A and 105B are coupled to the balun circuit 103. The mixers 105A and 105B perform frequency conversion on the received RF signals from the antenna 101 and output the resulting frequency-converted signal to the subsequent filters 107A and 107B, respectively. Further, the mixers 105A and 105B mix the received RF signal with a local oscillator signal to provide an intermediate frequency (IF) signal to the subsequent filters 107A and 107B, respectively. In the embodiment of the application, the mixers 105A and 105B may have the same or similar circuit structures and operations.

The filters 107A and 107B are coupled to the mixers 105A and 105B. The filters 107A and 107B operate to suppress an interfering wave from a neighbored channel. The filters 107A and 107B are configured to pass a predetermined band of frequencies from the output signals of the mixers 105A and 105B and generate the output I/Q channel signals.

In the embodiment of the application, the filters 107A and 107B may have the same or similar circuit structures and operations.

The mixers 105A and 105B will now be explained. The mixer 105A includes NMOS transistors M1-M4, as shown in FIG. 1. The NMOS transistor M1 includes a source (or drain) coupled to the non-inverted input of the operational amplifier OP1 of the filter 107A, a drain (or source) coupled to the input capacitor Cin1 and a gate receiving the clock signal Φ0. The NMOS transistor M2 includes a source (or drain) coupled to the source (or drain) of the NMOS transistor M1 and to the non-inverted input of the operational amplifier OP1 of the filter 107A, a drain (or source) coupled to the input capacitor Cin2 and a gate receiving the clock signal Φ180. The NMOS transistor M3 includes a source (or drain) coupled to the inverted input of the operational amplifier OP1 of the filter 107A, a drain (or source) coupled to the input capacitor Cin1 and a gate receiving the clock signal Φ180. The NMOS transistor M4 includes a source (or drain) coupled to the source (or drain) of the NMOS transistor M3 and to the inverted input of the operational amplifier OP1 of the filter 107A, a drain (or source) coupled to the input capacitor Cin2 and a gate receiving the clock signal Φ0.

The mixer 105B includes NMOS transistors M5-M8, as shown in FIG. 1. The NMOS transistor M5 includes a source (or drain) coupled to the non-inverted input of the operational amplifier OP2 of the filter 107A, a drain (or source) coupled to the input capacitor Cin1 and a gate receiving the clock signal Φ90. The NMOS transistor M6 includes a source (or drain) coupled to the source (or drain) of the NMOS transistor M5 and to the non-inverted input of the operational amplifier OP2 of the filter 107A, a drain coupled to the input capacitor Cin2 and a gate receiving the clock signal Φ270. The NMOS transistor M7 includes a source (or drain) coupled to the inverted input of the operational amplifier OP2 of the filter 107A, a drain (or source) coupled to the input capacitor Cin1 and a gate receiving the clock signal Φ270. The NMOS transistor M8 includes a source (or drain) coupled to the source (or drain) of the NMOS transistor M7 and to the inverted input of the operational amplifier OP2 of the filter 107A, a drain (or source) coupled to the input capacitor Cin2 and a gate receiving the clock signal Φ90.

The clock signals Φ0, Φ90, Φ180 and Φ270 are four clock phases generated by a clock divider 109 by dividing the oscillator signals 2LO+ and 2LO− wherein the oscillator signals 2LO+ and 2LO− are generated by a local oscillator (not shown).

The filter 107A is coupled to the mixer 105A and the filter 107B is coupled to the mixer 105B. The filter 107A is an active filter which includes the operational amplifier OP1, the resistor elements RF1-RF2 and R1-R3, and the capacitors C1-C4, C9-C12 and Ca1. The filter 107B is also an active filter which includes the operational amplifier OP2, the resistor elements RF3-RF4 and R4-R6, and the capacitors C5-C8, C13-C16 and Ca2. The filter 107A will be explained. The details of the filter 107B may be referenced to that of the filter 107A and thus are omitted here.

In the filter 107A, the capacitor C1 and the resistor element RF1 are coupled in parallel between the non-inverting input terminal and the inverting output terminal of the operational amplifier OP1. The capacitor C2 and the resistor element RF2 are coupled in parallel between the inverting input terminal and the non-inverting output terminal of the operational amplifier OP1. The capacitor C3 is coupled between the non-inverting input terminal of the operational amplifier OP1 and one terminal of the capacitor Ca1. The capacitor C4 is coupled between the inverting input terminal of the operational amplifier OP1 and another terminal of the capacitor Ca1. The capacitor C9 is coupled from the non-inverting input terminal of the operational amplifier OP1 to GND. The capacitor C10 is coupled from the inverting input terminal of the operational amplifier OP1 to GND. The capacitor C11 is coupled from the output terminal of the operational amplifier OP1 to GND. The capacitor C12 is coupled from the output terminal of the operational amplifier OP1 to GND. The capacitors C9-C12 may be parasitic capacitors or real capacitors. The resistor elements R1-R3 are coupled in series between the non-inverting output terminal and the inverting output terminal of the operational amplifier OP1. The capacitor Ca1 (also referred as "the attenuation capacitor") is further coupled in parallel with the resistor element R2. The resistor elements R1-R3 and the capacitor Ca1 form an attenuator A1.

In the filter 107B, the capacitor C5 and the resistor element RF3 are coupled in parallel between the non-inverting input terminal and the inverting output terminal of the operational amplifier OP2. The capacitor C6 and the resistor element RF4 are coupled in parallel between the inverting input terminal and the non-inverting output terminal of the operational amplifier OP2. The capacitor C7 is coupled between the non-inverting input terminal of the operational amplifier OP2 and one terminal of the capacitor Ca2. The capacitor C8 is coupled between the inverting input terminal of the operational amplifier OP2 and another terminal of the capacitor Ca2. The capacitor C13 is coupled from the non-inverting input terminal of the operational amplifier OP2 to GND. The capacitor C14 is coupled from the inverting input terminal of the operational amplifier OP2 to GND. The capacitor C15 is coupled from the output terminal of the operational amplifier OP2 to GND. The capacitor C16 is coupled from the output terminal of the operational amplifier OP2 to GND. The capacitors C13-C16 may be parasitic capacitors or real capacitors. The resistor elements R4-R6 are coupled in series between the non-inverting output terminal and the inverting output terminal of the operational amplifier OP2. The capacitor Ca2 (also referred as "the attenuation capacitor") is further coupled in parallel with the resistor element R5. The resistor elements R4-R6 and the capacitor Ca2 form an attenuator A2.

The output of the operational amplifier OP1 is I-channel output and the output of the operational amplifier OP2 is Q-channel output. Thus, the receiver 100 of FIG. 1 is a two-channel receiver. Further, the circuit configuration of the operational amplifiers OP1 and OP2 are not specified hereby.

The passband width of the filters 107A and 107B may be changed by controlling the capacitance value of the capacitors C1-C8 or the resistance of the resistor elements R1-R6.

In other possible embodiment of the application, the capacitors C1, C2, C5 and/or C6 may be coupled to GND. That is, the capacitors C1, C2, C5 and/or C6 may be coupled between the respective sources (or drains) of the transistors M1-M8 and GND, which is still within the spirit and scope of the application. For example, the capacitor C1 may be coupled between the source (or drain) of the transistor M1 and GND, and so on.

Figure 2:
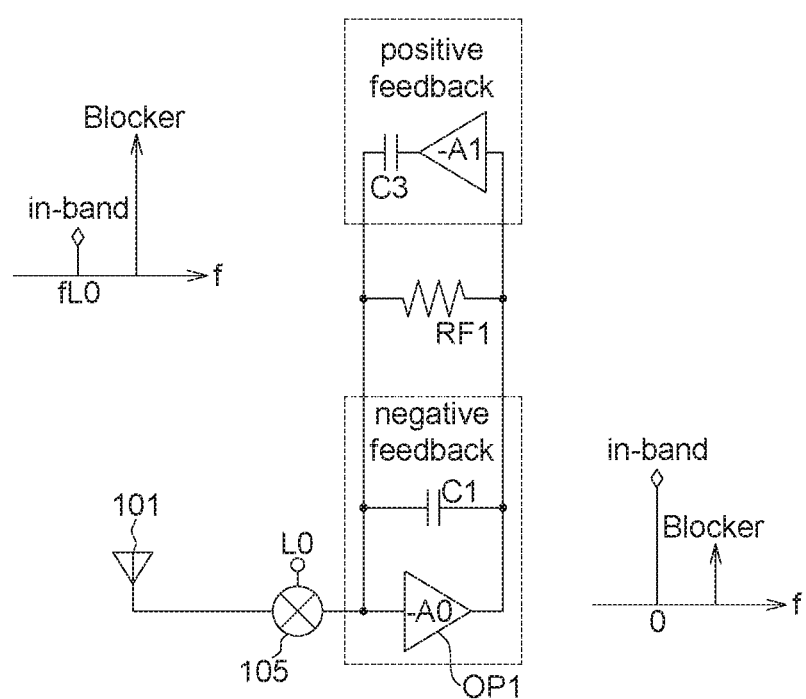
FIG. 2 shows an equivalent circuit model of the receiver of FIG. 1 according to the embodiment of the application.

FIG. 2 shows an equivalent circuit model of the receiver of FIG. 1 according to the embodiment of the application. In FIG. 2, the single-ended diagram is shown for simplicity, some elements (for example, the balun circuit 103, the filter 107B, the operational amplifier OP2, the resistor element RF2, the capacitors C2 and C4 of the filter 107A) are omitted.

As shown in FIG. 2, the capacitor C1 (and also the capacitor C2) and the operational amplifier OP2 form a negative feedback loop for performing negative feedback loop control on the output signals from the mixer 105A. The capacitor C3 (and also the capacitor C4) and the attenuator A1 form a positive capacitive feedback loop for performing positive capacitive feedback loop control on the output signals from the mixer 105A. The negative feedback loop and the positive capacitive feedback loop are coupled in parallel.

The gain (A0) of the operational amplifier OP1 is higher than 1 and the gain (A1) of the attenuator A1 is lower than 1. If the gain (A0) of the operational amplifier OP1 and the gain (A1) of the attenuator A1 are tuned to be large, then the Q factor of the receiver is also large. In other words, if A0*A1 is larger, then Q is also larger.

At the antenna input side of FIG. 2, the in-band signal, i.e. the wanted signal, is small while the "blocker", i.e. the out-band signal which is unwanted signals, is large. After processed by the receiver of the embodiment of the application, the in-band signal is amplified while the out-band signal is attenuated.

As shown in output side of the operational amplifier OP1/OP2, the receiver according to the embodiment of the application has better out-band rejection because of the high order LPF/BPF.

Figure 3:
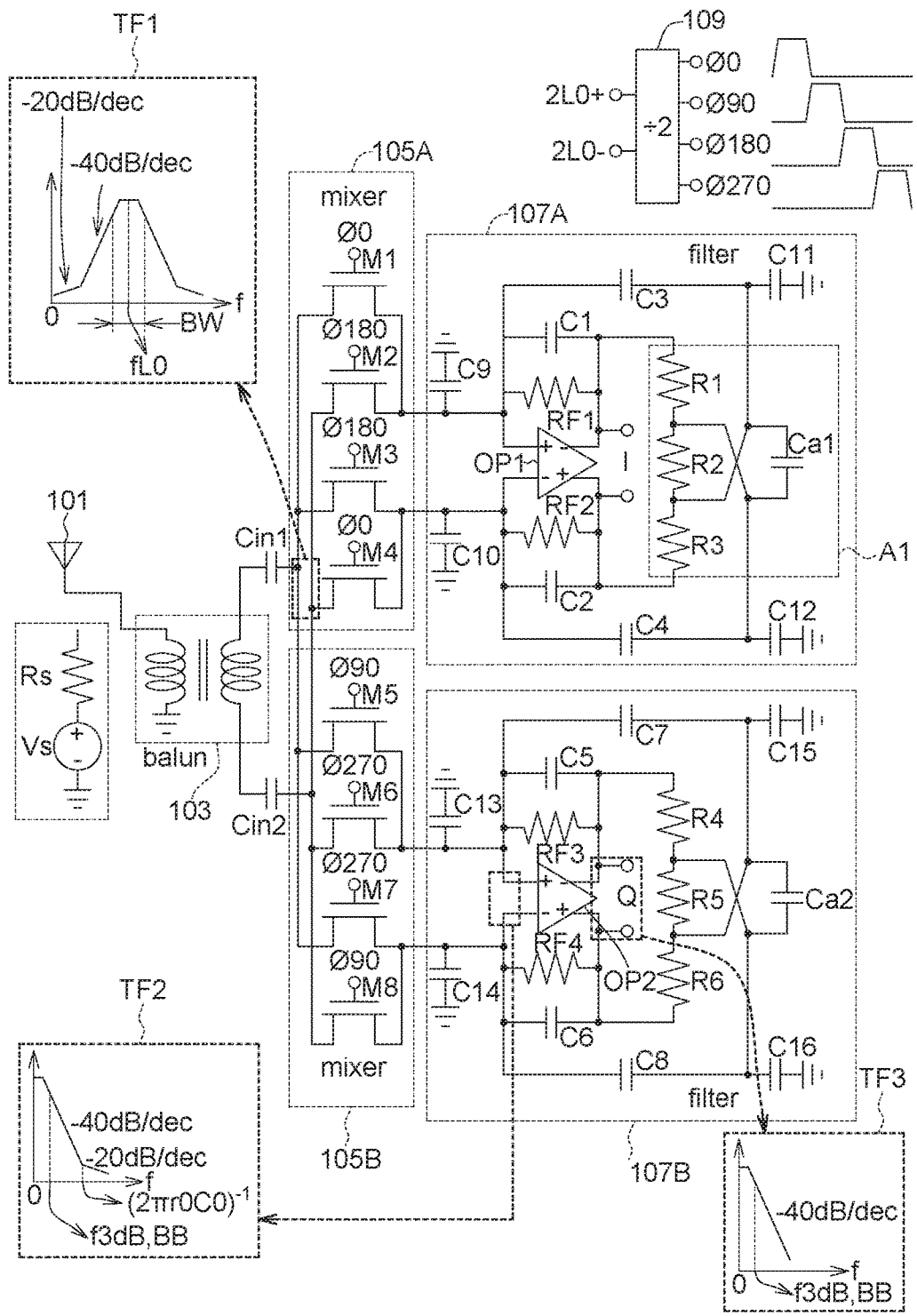
FIG. 3 shows the transfer functions of the receiver of the embodiment of the application.

FIG. 3 shows the transfer functions of the receiver 100 of the embodiment of the application. As shown in FIG. 3, at the input side of the mixer 105, the transfer function TF1 has the theoretical $4^{th}$ order BPF (band pass filter) characteristic wherein "fLO" refers to the LO frequency (i.e. the RF frequency) and "BW" is the bandpass filter bandwidth. At the input side of the operational amplifier OP2, the transfer function TF2 has the theoretical $2^{nd}$ order LPF characteristic. In the transfer function TF2, "f3dB,BB" is the baseband signal bandwidth, "r0" is the output impedance of the operational amplifier OP2 and "C0" is the capacitance at the output side of the operational amplifier OP2. At the output side of the operational amplifier OP2, the transfer function TF3 has the theoretical $2^{nd}$ order LPF characteristic.

Figure 4:
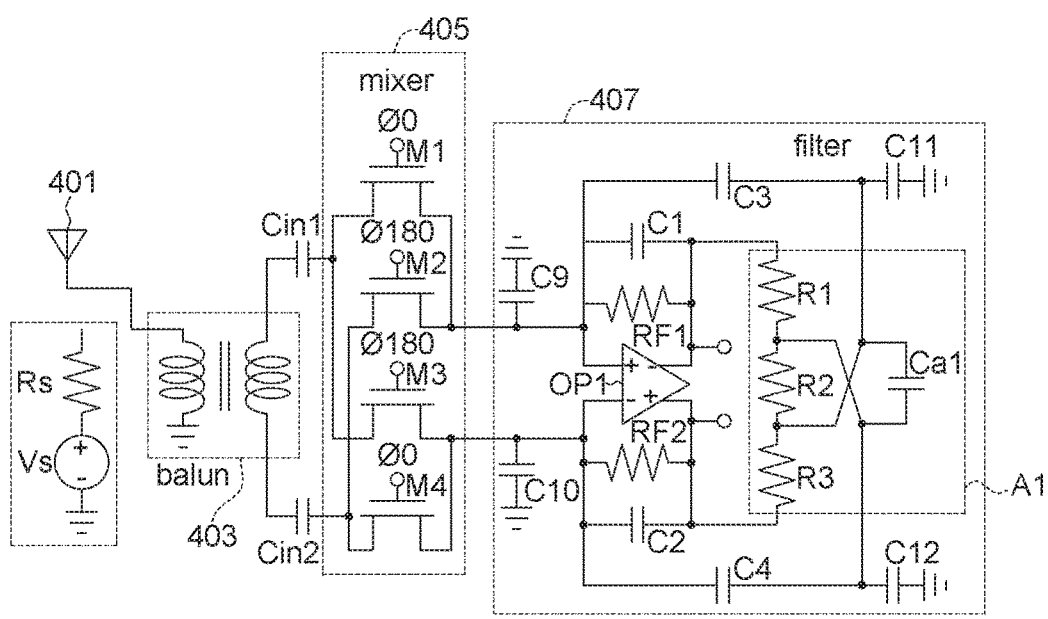
FIG. 4 shows a circuit diagram for a single-channel wireless communication receiver according to an embodiment of the application.

FIG. 4 shows a circuit diagram for a single-channel wireless communication receiver 400 according to an embodiment of the application. The wireless communication receiver 400 includes an antenna 401, a balun circuit 403, two input capacitors Cin1-Cin2, a mixer 405 and a filter 407. The mixer 405 and the filter 407 may have the same or similar circuit structure and operations with the mixer 105A/105B and the filter 107A/107B of FIG. 1 of the embedment of the application. Thus, the circuit operations of the single-channel receiver 400 may be referenced to that of the two-channel receiver 100. Also, the single-channel receiver 400 of the embodiment of the application has improved LPF and BPF performance.

Figure 5:
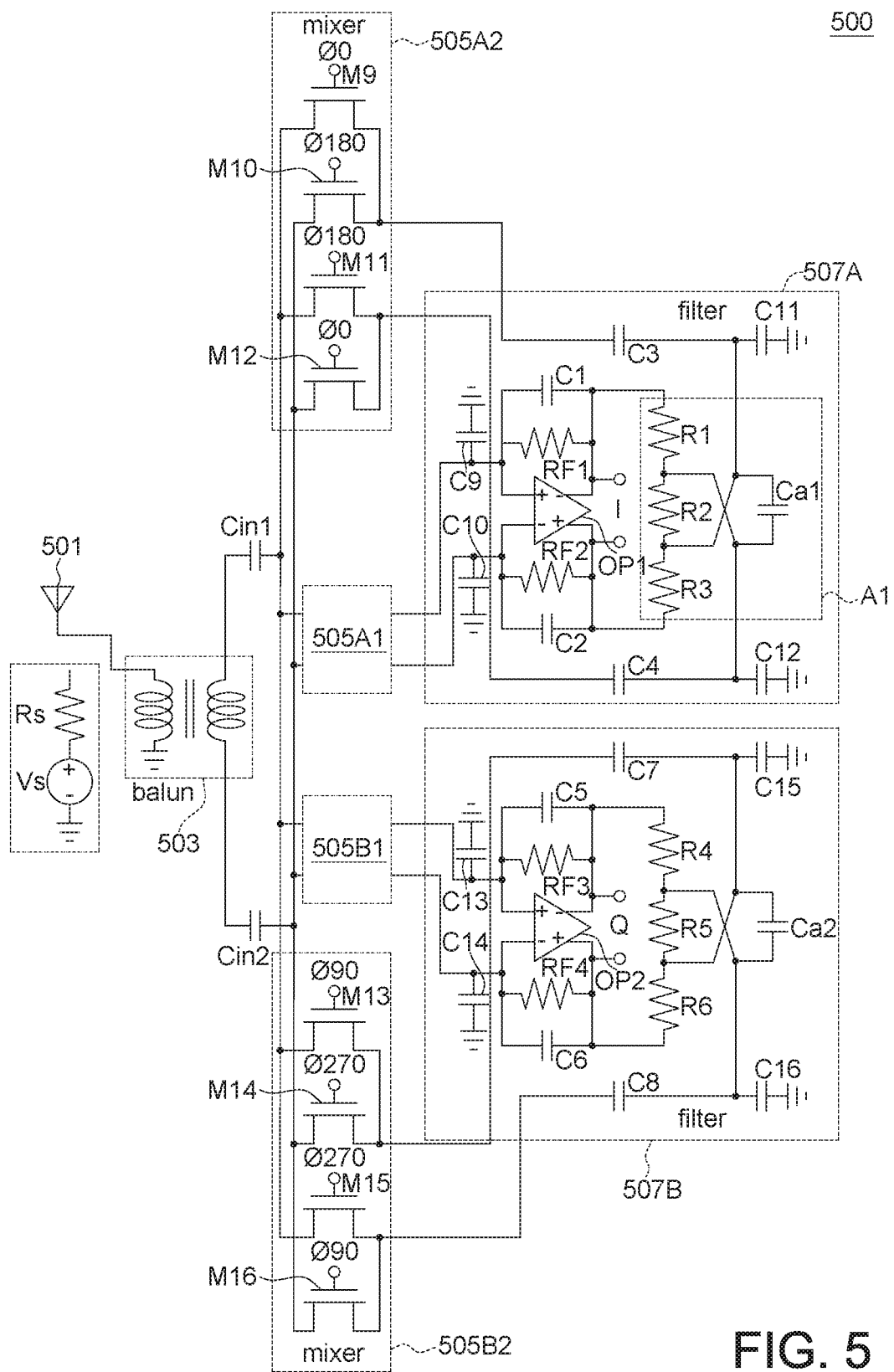
FIG. 5 shows a circuit diagram for a two-channel-four-mixer wireless communication receiver according to an embodiment of the application.

FIG. 5 shows a circuit diagram for a two-channel-four-mixer wireless communication receiver 500 according to an embodiment of the application. The wireless communication receiver 500 includes an antenna 501, a balun circuit 503, two input capacitors Cin1-Cin2, four mixers 505A1, 505A2, 505B1 and 505B2 and two filters 507A and 507B. The mixers 505A1, 505B1 and the filters 507A, 507B may have the same or similar circuit structure and operations with the mixers 105A, 105B and the filters 107A, 107B of FIG. 1 of the embedment of the application. Details of the mixers 505A1, 505B1 and the filters 507A, 507B are omitted here.

Now, the mixers 505A2 and 505B2 will be explained. The mixer 505A2 includes NMOS transistors M9-M12. The NMOS transistor M9 includes a source (or drain) coupled to the capacitor C3 of the filter 507A, a drain (or source) coupled to the input capacitor Cin1 and a gate receiving the clock signal Φ0. The NMOS transistor M10 includes a source (or drain) coupled to the source (or drain) of the NMOS transistor M9 and to the capacitor C3 of the filter 507A, a drain (or source) coupled to the input capacitor Cin2 and a gate receiving the clock signal Φ180. The NMOS transistor M11 includes a source (or drain) coupled to the capacitor C4 of the filter 507A, a drain (or source) coupled to the input capacitor Cin1 and a gate receiving the clock signal Φ180. The NMOS transistor M12 includes a source (or drain) coupled to the source (or drain) of the NMOS transistor M11 and to the capacitor C4 of the filter 507A, a drain coupled to the input capacitor Cin2 and a gate receiving the clock signal Φ0.

Similarly, the mixer 505B2 includes NMOS transistors M13-M16. The NMOS transistor M13 includes a source (or drain) coupled to the capacitor C7 of the filter 507B, a drain (or source) coupled to the input capacitor Cin1 and a gate receiving the clock signal Φ90. The NMOS transistor M14 includes a source (or drain) coupled to the source (or drain) of the NMOS transistor M13 and to the capacitor C7 of the filter 507B, a drain (or source) coupled to the input capacitor Cin2 and a gate receiving the clock signal Φ270. The NMOS transistor M15 includes a source (or drain) coupled to the capacitor C8 of the filter 507B, a drain coupled to the input capacitor Cin1 and a gate receiving the clock signal Φ270. The NMOS transistor M16 includes a source (or drain) coupled to the source (or drain) of the NMOS transistor M15 and to the capacitor C8 of the filter 507B, a drain (or source) coupled to the input capacitor Cin2 and a gate receiving the clock signal Φ90.

As shown in FIG. 5, the I-channel has the mixers 505A1 and 505A2 and the Q-channel has the mixers 505B1 and 505B2. The mixers 505A1 and 505A2, coupled in parallel, are configured to perform frequency conversion on the received RF signal from the antenna 101 by mixing the RF signal with the local oscillator signal (i.e. the clock signal) to provide the output signal to the filter 507A. The mixers 505A1 and 505A2 substantially have the same or similar functions and circuit configuration. Similarly, the mixers 505B1 and 505B2, coupled in parallel, are configured to perform frequency conversion on the received RF signal from the antenna 101 by mixing the RF signal with the local oscillator signal (i.e. the clock signal) to provide the output signal to the filter 507B. The mixers 505B1 and 505B2 substantially have the same or similar functions and circuit configuration.

Also, the two-channel-four-mixer receiver 500 of the embodiment of the application has improved LPF and BPF performance.

In possible embodiment of the application, the resulting signals from the operational amplifiers OP1 and OP2 may be further converted by analog-to-digital converters (ADC)

(not shown) into digital signals, which are then subject to digital processing operations by a digital baseband unit (not shown).

In the above embodiments of the application, the clock signal fed into the mixers 105A, 105B, 405, 505A1, 505A2, 505B1 and 5056B2 has four clock phases Φ0, Φ90, Φ180 and Φ270. However, the application is not limited by. In other possible embodiments of the application, the clock signal fed into the mixer(s) of the receiver may have six or eight or more clock phases, which is still within the spirit of the application.

As described above, compared with the state of the art (having $1^{st}$ order LPF and/or $2^{nd}$ order BPF), the receiver according to the embodiments of the application include higher-order filter (for example, but not limited by, theoretical $2^{nd}$ order LPF and/or theoretical $4^{th}$ order BPF). Thus, the receiver according to the embodiments of the application may have advantages over the state of the art, for example but not limited by, better out-band rejection and linearity.

Further, the receiver according to the embodiments of the application has negligible NF degradation because the noise of the resistor attenuator (for example, the attenuator A1 formed by the resistor elements R1-R3 and the capacitor Ca1 in FIG. 1) will be divided by the gain of operational amplifier OP1/OP2.

Still further, the Q factor of the receiver according to the embodiments of the application is tunable by tuning the gains of the attenuator and/or the operational amplifier wherein the Q factor may determine the filter shape. Thus, the theoretical $2^{nd}$ order LPF and/or the theoretical $4^{th}$ order BPF of the receiver according to the embodiments of the application may have good filter shape by tuning the Q factor (i.e. tuning the gains of the attenuator and/or the operational amplifier).

The receiver of the embodiments of the application may be applied in the wireless communication system, for example but not limited by, LTE-A (Long Term Evolution (LTE)-Advanced) system.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A wireless communication receiver, comprising:
an antenna for receiving a wireless communication signal;
a first mixer, coupled to the antenna, for performing frequency conversion on the received wireless communication signal from the antenna by mixing the wireless communication signal with a local oscillator signal to provide a first intermediate frequency (IF) signal; and
a first filter, coupled to the first mixer, configured to pass a predetermined band of frequencies of the first IF signal of the first mixer and to generate a first channel signal,
wherein the first filter includes:
a negative feedback loop coupled to the first mixer for performing negative feedback loop control on the first IF signal from the first mixer; and
a positive capacitive feedback loop coupled to the first mixer for performing positive capacitive feedback loop control on the first IF signal from the first mixer, the negative feedback loop and the positive capacitive feedback loop being coupled in parallel;
wherein the negative feedback loop includes an operational amplifier, a first capacitor and a second capacitor, the first capacitor being coupled between a first input terminal and a first output terminal of the operational amplifier, and the second capacitor being coupled between a second input terminal and a second output terminal of the operational amplifier;
wherein the positive capacitive feedback loop includes: a third capacitor and a fourth capacitor; and an attenuator, coupled to the third capacitor and the fourth capacitor,
the third capacitor is coupled between the first input terminal of the operational amplifier and a terminal of an attenuation capacitor of the attenuator, and
the fourth capacitor is coupled between the second input terminal of the operational amplifier and another terminal of the attenuation capacitor of the attenuator.

2. The wireless communication receiver according to claim 1, wherein the attenuator of the positive capacitive feedback loop includes a plurality of resistor elements coupled in series between the first output terminal and the second output terminal of the operational amplifier, and one of the resistor elements is coupled to the attenuation capacitor in parallel.

3. The wireless communication receiver according to claim 2, wherein the first mixer includes a plurality of active elements coupled between the antenna and the first input terminal of the operational amplifier or between the antenna and the second input terminal of the operational amplifier, the plurality of the active elements of the mixer being controlled by a plurality of clock phases of the local oscillator signal, respectively.

4. The wireless communication receiver according to claim 3, further comprising:
a second mixer, coupled to the antenna, for performing frequency conversion on the received wireless communication signal from the antenna by mixing the wireless communication RF signal with the local oscillator signal to provide a second intermediate frequency (IF) signal; and
a second filter, coupled to the second mixer, configured to pass a predetermined band of frequencies of the second IF signal of the second mixer and to generate a second channel signal.

5. The wireless communication receiver according to claim 4, further comprising:
a third mixer, coupled between the antenna and the first filter; and
a fourth mixer, coupled between the antenna and the second filter,
wherein
the first and the third mixers, coupled in parallel, are configured to perform performing frequency conversion on the received wireless communication signal from the antenna by mixing the wireless communication RF signal with the local oscillator signal to provide the first intermediate frequency (IF) signal; and
the second and the fourth mixers, coupled in parallel, are configured to perform performing frequency conversion on the received wireless communication signal from the antenna by mixing the wireless communication RF signal with the local oscillator signal to provide the second intermediate frequency (IF) signal.

* * * * *